United States Patent
Rothleitner

(10) Patent No.: US 9,577,039 B2
(45) Date of Patent: Feb. 21, 2017

(54) TRANSISTOR STRUCTURE WITH REDUCED PARASITIC SIDE WALL CHARACTERISTICS

(71) Applicant: Infineon Technologies AG, Neubiberg (DE)

(72) Inventor: Hubert Rothleitner, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/585,211

(22) Filed: Dec. 30, 2014

(65) Prior Publication Data
US 2016/0190248 A1     Jun. 30, 2016

(51) Int. Cl.
| | |
|---|---|
| *H01L 29/06* | (2006.01) |
| *H01L 29/423* | (2006.01) |
| *H01L 29/78* | (2006.01) |
| *H01L 29/49* | (2006.01) |
| *H01L 29/66* | (2006.01) |
| *H01L 29/10* | (2006.01) |

(52) U.S. Cl.
CPC ....... *H01L 29/0692* (2013.01); *H01L 29/0696* (2013.01); *H01L 29/4238* (2013.01); *H01L 29/7833* (2013.01); *H01L 29/7835* (2013.01); *H01L 29/1087* (2013.01); *H01L 29/4933* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 6,452,222 B1* | 9/2002 | Itoh | H01L 29/0696 |
| | | | 257/288 |
| 2015/0325639 A1* | 11/2015 | Liao | H01L 29/41758 |
| | | | 327/434 |

OTHER PUBLICATIONS

R.R. Harrison, The MOS Transistor in Weak Inversion; EE 5720 5720 University of Utah, pp. 1-15, Jan. 2010.
Willy Sansen, Leuven, Belgium "The Strength of Weak Inversion", pp. 1-22, Nov. 2010.
www.ece.utah.edu/; Common Centroed Differential Pair Layout, pp. 1-4, Jan. 2010.

* cited by examiner

*Primary Examiner* — Alexander Ghyka
(74) *Attorney, Agent, or Firm* — Viering, Jentschura & Partner MBB

(57) ABSTRACT

A MOS transistor structure for matched operation in weak-inversion or sub-threshold range (e.g. input-pair of operational amplifier, comparator, and/or current-mirror) is disclosed. The transistor structure may include a well region of any impurity type in a substrate (SOI is included). The well-region can even be represented by the substrate itself. At least one transistor is located in the well region, whereby the active channel-region of the transistor is independent from lateral isolation interfaces between GOX (gate oxide) and FOX (field oxide; including STI-shallow trench isolation).

10 Claims, 6 Drawing Sheets

TRANSISTOR STRUCTURE WITH REDUCED PARASITIC SIDE WALL CHARACTERISTICS

TECHNICAL FIELD

Various embodiments relate to a transistor structure with a reduced parasitic "side wall" transistor regions.

BACKGROUND

Certain low power analog circuits utilize various types of field effect transistors (e.g. complementary metal-oxide-semiconductor "CMOS"; metal-oxide-semiconductor field-effect transistor "MOSFET"; metal-insulation-semiconductor field-effect transistor "MISFET"; etc.). Some low power applications use matched pairs of such transistors, however the "matching" properties of these transistors begins to change for the worse at lower operating currents. This is because, in low power applications, the transistors operate in the so-called "Weak Inversion" mode (or sub-threshold region), in which a low drain current ($I_{ds}$) is flowing. Further, when operating in the sub-threshold region, various phenomena which adversely affect the performance of the transistor may become dominant. Some of these adverse phenomena are related to the mechanical structure of a typical field effect transistor. In most MOSFET devices, so-called "side wall" transistors form at the edges of the gate region and adversely affect the performance of such devices, particularly when a closely matched pair of transistors is required for a given application.

SUMMARY

In various embodiments, a transistor structure is provided. The transistor structure may include a well region of a first impurity type in a substrate with at least one transistor in the well region, a structure of the first impurity type enclosing the well region, and a trench or a field oxide isolation layer enclosing the structure.

BRIEF DESCRIPTION OF THE DRAWINGS

In the drawings, like reference characters generally refer to the same parts of the disclosure throughout the different views. The drawings are not necessarily to scale, emphasis instead generally being placed upon illustrating the principles of the disclosure. In the following description, various embodiments of the disclosure are described with reference to the following drawings, in which.

DESCRIPTION

The following detailed description refers to the accompanying drawings that show, by way of illustration, specific details and embodiments in which the disclosure may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with the implied side or surface. The word "over" used with regards to a deposited material formed "over" a side or surface may be used herein to mean that the deposited material may be formed "indirectly on" the implied side or surface with one or more additional layers being arranged between the implied side or surface and the deposited material.

In various embodiments, a transistor with reduced parasitic "side wall" transistor regions is disclosed.

Figure 1:
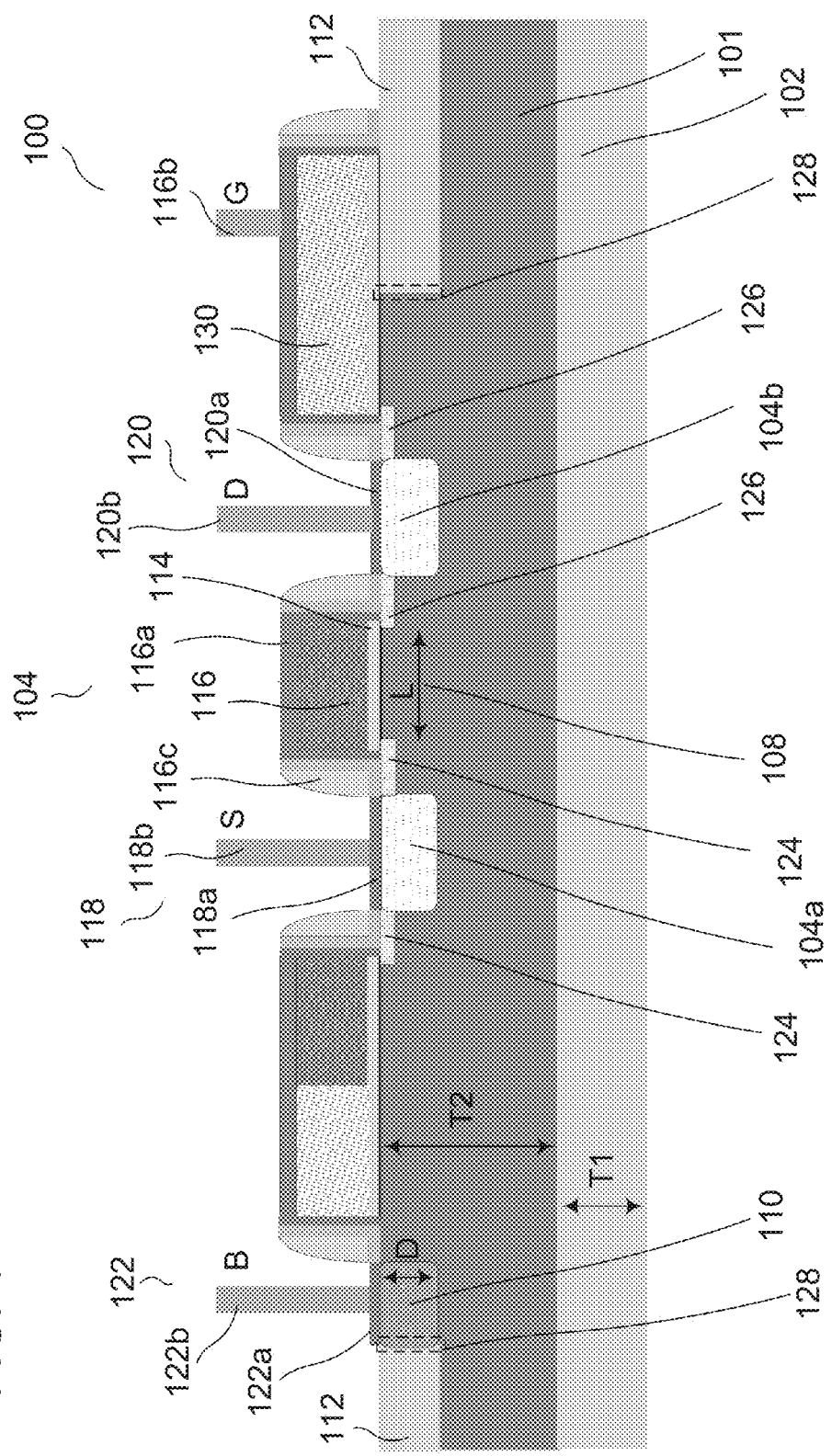
FIG. 1 shows, in accordance with a potential embodiment, a longitudinal cross-sectional representation of a transistor structure.
Figure 2:
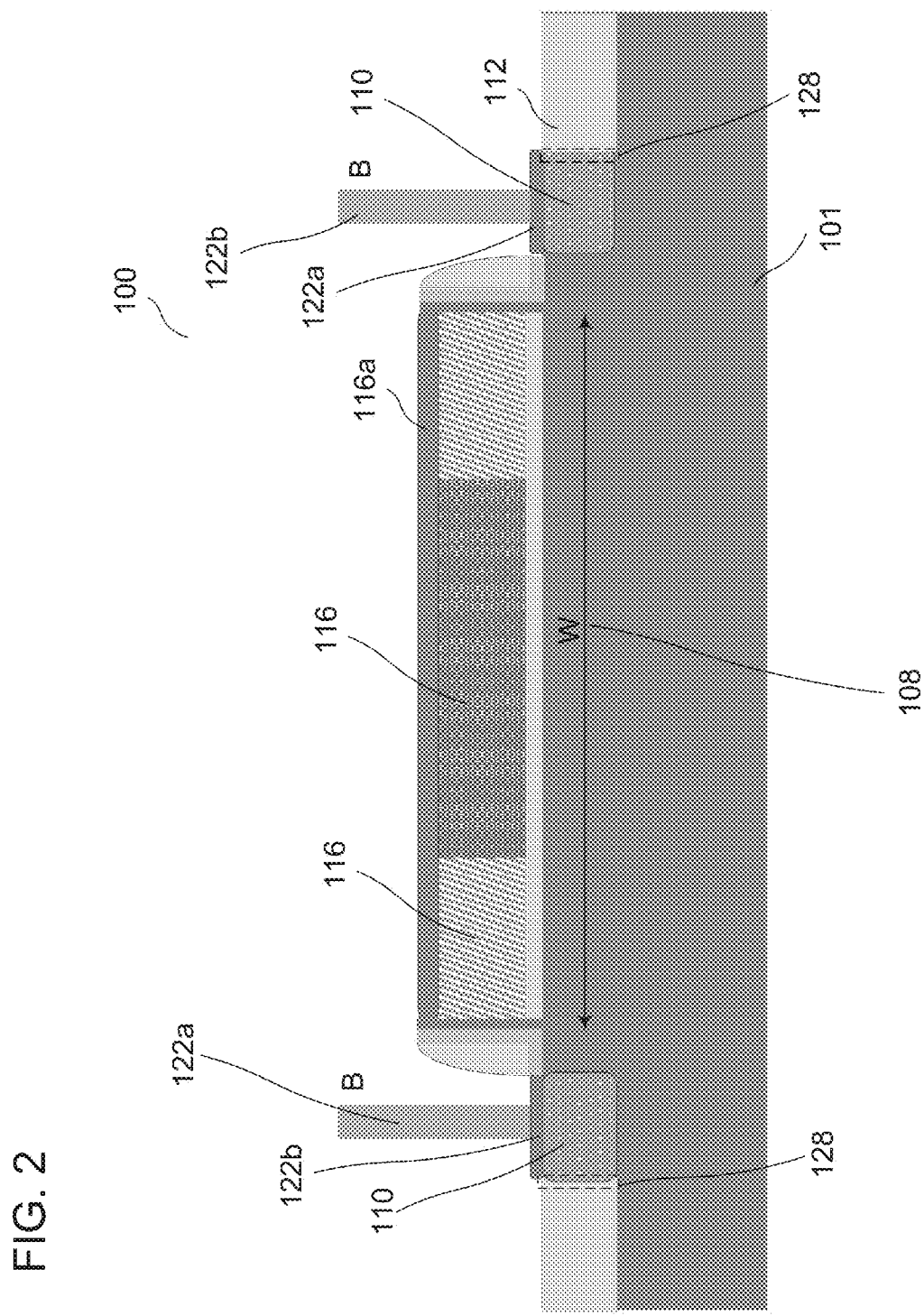
FIG. 2 shows, according to an embodiment, a transverse cross-sectional representation of a transistor structure.
Figure 3:
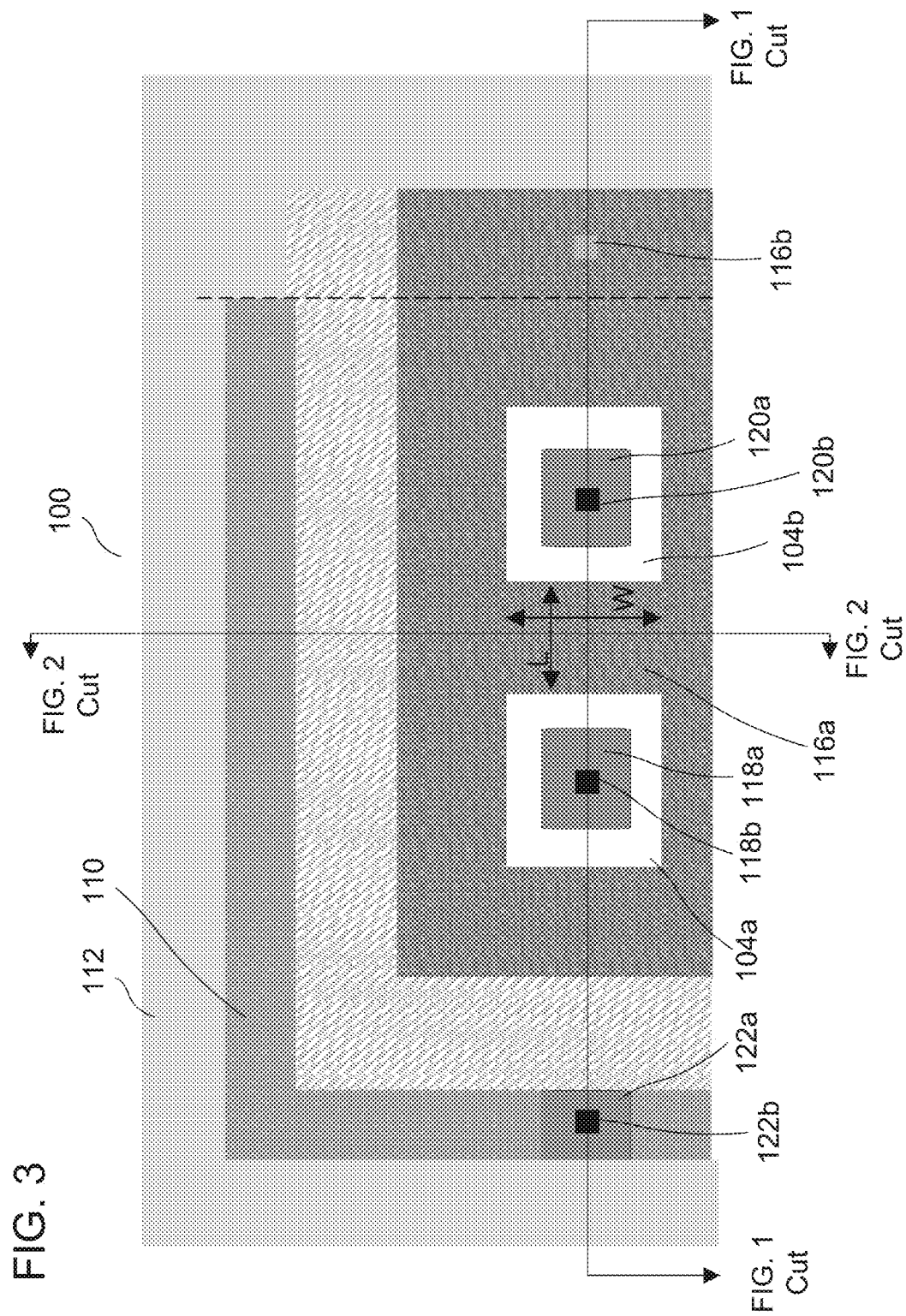
FIG. 3 shows a planar top-down view of an embodiment of the transistor structure of FIGS. 1 & 2.

The transistor structure 100, as illustrated in FIGS. 1-3, may include a substrate 102, a well region 101 of a first impurity type in the substrate 102, at least one transistor 104 formed at least partially on the well region 101, a portion of the well region 101 may be implemented as a transistor channel 108 of the transistor 104. The transistor 104 may include a first diffusion region 104a of a second impurity type in the well region 101, and a second diffusion region 104b of the second impurity type in the well region 101. According to an embodiment, the transistor structure 100 may include a structure of the first impurity type 110 in the substrate 102 enclosing the well region 101. According to various embodiments, the structure of the first impurity type 110 is implemented as a bulk diffusion region for connection to the well region 101. The transistor structure 100 may further include a trench or field oxide isolation layer 112 in the substrate 102 enclosing the structure of the first impurity type 110. In some embodiments, an impurity concentration in the structure of the first impurity type 110 is higher than an impurity concentration in the well region 101.

In various embodiments, the transistor 104 may further include an oxide layer 114 disposed over the channel 108, a gate electrode 116 on the oxide layer 114, a source electrode 118 on the first diffusion region 104a, a drain electrode 120 on the second diffusion region 104b, and at least one body connection electrode 122 on the structure of the first impurity type 110. According to various embodiments, the transistor 104 may include at least one lightly doped source region 124 of the second impurity type extending from the perimeter of the first diffusion region 104a and into the channel 108, and at least one lightly doped drain region 126 of the second impurity type extending from the perimeter of the second diffusion region 104b and into the channel 108.

According to various embodiments, the substrate 102 may include or essentially consist of various materials, e.g. a semiconductor material such as various elemental and/or compound semiconductors. The substrate 102 may include or essentially consist of, for example, glass, and/or various polymers. The substrate 102 may be a silicon-on-insulator (SOI) structure. In various embodiments, the substrate 102 may include or essentially consist of one or more of the following materials: a polyester film, a thermoset plastic, a metal, a metalized plastic, a metal foil, and a polymer. In some embodiments, the substrate 102 may be a multilayer substrate. According to various embodiments, the substrate 102 may have a thickness T1 in the range from about 10 µm to about 700 µm. According to various embodiments, the substrate 102 may have a thickness T1 which may be any thickness desirable for a given application. According to various embodiments, the substrate 102 may be formed into any shape that may be desired for a given application.

In various embodiments, the well region 101 may be formed in and/or on the substrate 102. The well region 101 may be an impurity doped region in the substrate 102, e.g. an n-type or p-type region in a semiconductor substrate. In some embodiments, the well region 101 may be formed in the substrate 102 through various techniques, e.g. vapor-phase epitaxy, diffusion, and/or ion implantation, etc. In various embodiments, the well region 101 may have an impurity concentration in the range from about $10^{13}$ cm$^{-3}$ to about $10^{18}$ cm$^{-3}$. According to various embodiments, the well region may have a thickness T2, in the range from about 0.5 µm to about 10 µm. According to a first example of an embodiment, the well region 101 is implemented as a p-type well region in a semiconductor substrate 102. In a second example of an embodiment, the well region 101 is implemented as an n-type well region in a semiconductor substrate 102.

According to various embodiments, the transistor structure 100 may include a first diffusion region 104a. In various embodiments, the first diffusion region 104a may be formed in and/or on the well region 101. In some embodiments, the first diffusion region 104a is implemented as an impurity doped region in the well region 101, e.g. an n-type or p-type region in a semiconductor substrate. In some embodiments, the first diffusion region 104a is formed in the well region 101 through various techniques, e.g. vapor-phase epitaxy, diffusion, and/or ion implantation, etc. According to various embodiments, the first diffusion region 104a may have an impurity concentration in the range from about $10^{18}$ cm$^{-3}$ to $5 \times 10^{21}$ cm$^{-3}$. According to an embodiment, the first diffusion region 104a is implemented as a p-type region in the well region 101. In another embodiment, the first diffusion region 104a is implemented as an n-type well region in the well region 101. According to various embodiments, the first diffusion region 104a may serve as a source and/or drain region for the transistor 104. In at least one embodiment and various other embodiments, the first diffusion region 104a is implemented as an n++ type doped source region for the transistor 104. In some embodiments and various other embodiments, the first diffusion region 104a is implemented as a p++ type doped source or drain region 104a for the transistor 104. In at least one embodiment, the second diffusion region 104a may be implemented as a common source or drain region for a plurality of transistors.

According to various embodiments, the transistor structure 100 may include a second diffusion region 104b, which may be substantially similar to the first diffusion region 104a, described above and may contain many of the same materials.

In various embodiments, the transistor channel 108 may be formed between the first diffusion region 104a and the second diffusion region 104b. The transistor channel 108 may have a length, shown in FIGS. 1 & 3 and indicated by reference character L, which is the distance between the first diffusion region 104a and the second diffusion region 104b, in the range from about 0.04 µm to about 10 µm. According to various embodiments, the length L of the transistor channel 108 may be scaled to any distance desirable for a given application. In various embodiments the transistor channel 108 may have a width, indicated by reference character W shown in FIGS. 2 & 3, in the range from about 0.04 µm to about 10 µm. According to various embodiments, the width W of the transistor channel 108 may be scaled to any distance desirable for a given application.

According to various embodiments, the structure of the first impurity type 110 enclosing the well region 101 may be formed in the substrate 102 through various techniques, e.g. vapor-phase epitaxy, diffusion, and/or ion implantation, etc. The structure of the first impurity type 110 may have a depth, indicated by reference character D, below the surface of the substrate 102. In various embodiments the depth D is in the range from about 1 nm to about 500 nm. The depth D may be implemented as any depth desirable for a given application. According to various embodiments, the structure of the first impurity type 110 may have an impurity concentration in the range from about $10^{18}$ cm$^{-3}$ to $5 \times 10^{21}$ cm$^{-3}$. According to various embodiments, the structure of the first impurity type 110 may have any impurity concentration desirable for a given application. According to at least one and various other embodiments, the structure of the first impurity type 110 is implemented as a p-type or n-type region in the substrate 102 which substantially and/or completely encloses the well region 101. According to various embodiments, the structure of the first impurity type 110 may be formed into any shape that may be desired for a given application.

According to various embodiments, the transistor structure 100 includes a trench or field oxide isolation layer 112 in the substrate 102 enclosing the structure of the first impurity type 110. In an embodiment, the trench or field oxide isolation layer completely encloses and/or surrounds the structure of the first impurity type 110 and serves to electrically isolate and/or insulate the transistor structure 100 from other electrical components which may be formed on the substrate 102. According to various embodiments, the trench or field oxide isolation layer 112 may be implemented as a so-called shallow trench isolation (STI) layer. In various embodiments, the trench or field oxide isolation layer 112 may be implemented as a LOCOS (local oxidation of silicon) field oxide. The trench or field oxide isolation layer 112 may be composed primarily of and/or may contain various dielectric materials, e.g. a semiconductor oxide, various high-k dielectrics, etc. According to an embodiment, the trench or field oxide isolation layer 112 may be essentially consist of and/or may contain any element desirable for a given application.

According to various embodiments, the transistor structure 100 includes an oxide layer 114, e.g. a gate oxide, over the channel 108. The oxide layer 114 may have a thickness between about 1 nm and about 50 nm. According to various embodiments, the oxide layer may have any thickness that may be desirable for a given application. The oxide layer 114 may be implemented as a semiconductor oxide layer. In at least one embodiment, the oxide layer 114 is implemented as a silicon dioxide layer. In various embodiments, the oxide layer 114 may include and/or be composed essentially of high-k dielectrics, e.g. various IVb metal silicates such as hafnium silicates and/or a zirconium silicate. According to an embodiment, the oxide layer may be essentially consist of and/or may contain any element desirable for a given application. According to an embodiment, the oxide layer 114 is implemented as a gate oxide layer situated between the transistor 104 and the channel 108. The oxide layer, in some embodiments, serves to electrically isolate and/or insulate at least a portion of the transistor 104 from the channel 108. In some embodiments, the oxide layer 114 does not extend past the perimeter of the gate electrode 116, while in other embodiments the oxide layer 114 may cover and/or be formed over the entirety of the well region 101.

According to various embodiments, the transistor 104 includes a gate electrode 116 on the oxide layer 114. The gate electrode 116 may be implemented as a stack structure formed on the oxide layer 114. In various embodiments where the gate electrode 116 is implemented as a stack structure, the gate electrode 116 may include a semiconductor layer, such as an n-type or p-type polysilicon, formed on the oxide layer 114. In at least one embodiment the semiconductor layer is implemented as a combination of several p-type and n-type polysilicon structures. According to various embodiments, the gate electrode may have a conductive layer 116a formed over the semiconductor layer. In at least one embodiment, this conductive layer may be a self-aligned silicide layer, e.g. a cobalt silicide, titanium silicide, nickel silicide, platinum silicide, and/or a tungsten silicide. In some embodiments, the conductive layer 116a may be formed of a metallic material, a metalized material, a metal foil, an elemental metal, and/or a metal alloy. The conductive layer 116a may have a thickness between about 2 nm and about 15 nm. According to various embodiments, conductive layer 116a may have any thickness that may be desirable for a given application. In various embodiments, the transistor 104 might include at least one spacer structure 116c on at least one sidewall of the stack structure. The spacer structure 116c may be implemented as various nitrides, in some embodiments; the spacer structure 116c may include or essentially consist of tetraethyl orthosilicate. According to various embodiments, the transistor structure 100 includes an electrical contact 116b formed and/or arranged over a top side of the gate electrode 130. In some embodiments, the electrical contact 116b may be formed of a metallic material, a metalized material, a metal foil, an elemental metal, and/or a metal alloy. The electrical contact 116b may include or may essentially consist of cobalt silicide, titanium silicide, nickel silicide, platinum silicide, and/or a tungsten silicide.

According to various embodiments, the transistor structure 100 includes a source electrode 118 formed over and/or on a surface of the first diffusion region 104a. In some embodiments, the source electrode 118 is electrically coupled and/or in electrical contact or communication with the first diffusion region 104a. In some embodiments, the source electrode 118 includes a base layer 118a formed on a surface of the first diffusion region 104a and a conductive extension 118b formed on the base layer 118a. The base layer 118a may be a self-aligned silicide layer, e.g. a cobalt silicide, titanium silicide, nickel silicide, platinum silicide, and/or a tungsten silicide. In some embodiments, the base layer 118a may be formed of a metallic material, a metalized material, a metal foil, an elemental metal, and/or a metal alloy. In some embodiments, the conductive extension 118b may be formed of a metallic material, a metalized material, an elemental metal, and/or a metal alloy. In at least one embodiment, the base layer 118a and the conductive extension 118b may be formed together, i.e. may consist of a monolithic structure, while in other embodiments the base layer 118a and the conductive extension 118b are formed in discrete steps.

According to various embodiments, the transistor structure 100 includes a drain electrode 120 formed over and/or on a surface of the second diffusion region 104b. In some embodiments, the drain electrode 120 is electrically coupled and/or in electrical contact or communication with the second diffusion region 104b. In some embodiments, the drain electrode 120 includes a base layer 120a formed on a surface of the second diffusion region 104b and a conductive extension 120b formed on the base layer 120a. The base layer 120a may be substantially similar to the base layer 118a, and the conductive extension 120b may be substantially similar to the conductive extension 118b, described above.

According to various embodiments, the transistor structure 100 includes at least one body connection electrode 122 formed on the structure of the first impurity type 110. In some embodiments, the at least one body connection electrode 122 is electrically coupled and/or in electrical contact or communication with the structure of the first impurity type 110. In some embodiments, the at least one body connection electrode 122 is electrically coupled and/or in electrical contact or communication with the first diffusion region 104a, while in other embodiments the at least one body connection is electrically coupled to the second diffusion region 104b. In some embodiments, the at least one body connection electrode 122 includes a base layer 122a formed on a surface of the structure of the first impurity type 110 and a conductive extension 122b formed on the base layer 122a. The base layer 122a may be substantially similar to the base layer 118a, and the conductive extension 122b may be substantially similar to the conductive extension 118b, described above.

According to various embodiments, the transistor structure 100 includes at least one lightly doped source region 124 extending from the perimeter of the first diffusion region 104a and into the channel 108. In some embodiments, the lightly doped source region 124 is implemented as a p-type impurity doped region in the well region 101. In some embodiments, the lightly doped source region 124 is implemented as an n-type impurity doped region in the well region 101. In some embodiments, the lightly doped source region may have an impurity concentration from about $10^{16}$ cm$^{-3}$ to about $10^{19}$ cm$^{-3}$. The lightly doped source region 124 may be formed in the substrate 102 and/or well region 101 through various techniques, e.g. vapor-phase epitaxy, diffusion, and/or ion implantation, etc.

According to various embodiments, the transistor structure 100 includes at least one lightly doped drain region 126 of the second impurity type extending from the perimeter of the second diffusion region 106 and into the channel 108. In some embodiments, the lightly doped drain region 126 is implemented as a p-type impurity doped region in the well region 101. In some embodiments, the lightly doped drain region 126 is implemented as an n-type impurity doped region in the well region 101. In some embodiments, the lightly doped drain region may have an impurity concentration from about $10^{16}$ cm$^{-3}$ to about $10^{19}$ cm$^{-3}$. The lightly doped drain region 126 may be formed in the substrate 102 and/or well region 101 through various techniques, e.g. vapor-phase epitaxy, diffusion, and/or ion implantation, etc. In various embodiments, the transistor structure 100 includes at least one defined border 128 where the oxide layer 114 stops and the trench or field oxide isolation layer 112 begins. In other words the border 128 is a well-defined transition region between the oxide layer 114 and the trench or field oxide isolation layer 112, i.e. a border where the oxide layer 114 and the trench or field oxide isolation layer 112 are in physical contact.

Figure 4:
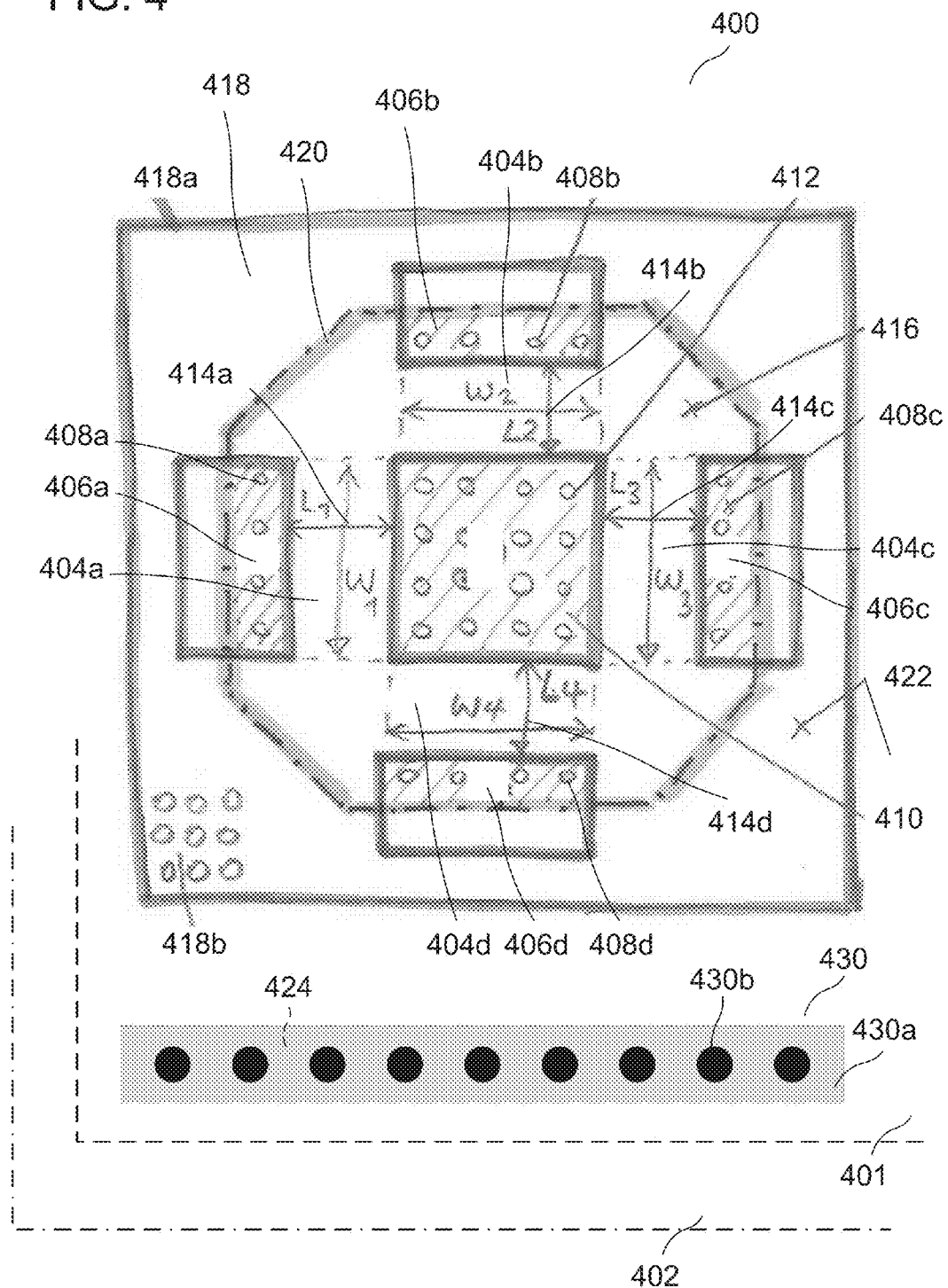
FIG. 4 shows, according to an embodiment a planar top-down view of a quad-transistor structure.

According to various embodiments, as illustrated in FIG. 4, the transistor structure 100 can be implemented as a type of multi-transistor structure 400. In various embodiments, the multi-transistor structure 400 includes a well region 401. The well region 401 may be substantially similar to the well region 101, described above, and may be formed through many of the processes and may contain many of the same physical and/or electrical properties. In various embodiments, the multi-transistor structure 400 includes substrate 402. The substrate 402 may be substantially similar to the substrate 102, described above, and may be formed through many of the processes and may contain many of the same properties. The multi-transistor structure 400 is similar to the transistor structure 100 in many respects, differing mainly in the number of transistors 404 it contains. The illustrative embodiment of the multi-transistor structure 400, depicted in FIG. 4 contains four transistors, represented by reference FIGS. 404a-404d. The transistors 404a-404d may be substantially similar to the at least one transistor 104 and may be formed through many of the processes described above. According to various embodiments, the transistors 404a-404d are each implemented with independent source diffusion regions 406a-406d. The source diffusion regions 406a-406d are analogous to the first and second diffusion regions 104a and 104b, respectively, described above and may be formed using many of the same processes. According to various embodiments, the transistors 404a-404d are each implemented with source electrodes 408a-408d. The source electrodes 408a-408d are analogous to the source electrode 118 described above and may be implemented using many of the same materials and processes. According to an embodiment, the multi-transistor structure 400 contains a common drain diffusion region 410. The common drain diffusion region 410 may be located in a central portion of the multi-transistor structure 400. In some embodiments, the common drain diffusion region 410 is arranged between the source electrodes 408a-408d. In the embodiment depicted in FIG. 4, the source electrodes 408a-408d are arranged around the perimeter of the common drain diffusion region 410 in a cross-like configuration, however it should be noted that this geometry is exemplary and not intended to be limiting. The source electrodes 408a-408d may be arranged around the common drain diffusion region 410 in a variety of configurations, e.g. in some embodiments the common drain diffusion region 410 and the source electrodes 408a-408d may be parallel to each other. According to an embodiment, the common drain diffusion region 410 is analogous to the first and second diffusion regions 104a and 104b, respectively, described above and may be formed using many of the same processes and materials. According to an embodiment, the multi-transistor structure 400 contains a common drain electrode 412. The common drain electrode 412 is analogous to the drain electrode 120 described above and may be implemented using many of the same materials and processes. According to an embodiment, the common drain electrode 412 and the common drain diffusion region 410 are coextensive and/or substantially overlap one another. According to an embodiment, the multi-transistor structure 400 contains a channel region for each of the transistors it may contain. In the embodiment depicted in FIG. 4, the multi-transistor structure 400 is implemented with four channel regions 414a-414d for each of the transistors 404a-404d. According to various embodiments, the channel regions 414a-414d are analogous to the channel 108 described above and may be implemented using many of the same materials and processes. In various embodiments, the length and width of each of the channel regions 414a-414d are depicted by references figures $W_x$ and $L_x$ in FIG. 4, i.e. channel region 414a has a width $W_1$ and a length $L_1$, etc. According to an embodiment, the multi-transistor structure 400 contains a gate oxide layer 416. In various embodiments, the gate oxide layer 416 is formed over the common drain diffusion region 410 and extends over each of the channel regions 414a-414d, with a defined border interface 420 where the gate oxide layer 416 switches to the trench or field oxide layer 422. According to various embodiments, the gate oxide layer 416 is analogous to the oxide layer 114 described above and may be implemented using many of the same materials and processes. According to an embodiment, the multi-transistor structure 400 contains a gate electrode structure 418, which may be implemented as a gate base layer 418a and a plurality of gate contacts 418b. In the embodiment depicted in FIG. 4, the gate base layer 418a is shown in transparency for clarity of detail of the other elements contained in the multi-transistor structure 400. The gate electrode structure 418 is analogous to gate electrode 116 and may be formed using many of the same processes and material and may share many of the same physical and/or electrical properties as the gate electrode 116. According to an embodiment, the multi-transistor structure 400 contains a border interface 420 where the field oxide or shallow trench isolation layer 422 is located outside of the gate oxide layer 416. The shallow trench or field oxide isolation layer 422 is analogous to the trench or field oxide isolation layer 112 and may be formed from the same and/or similar materials and may share many of the same physical and/or electrical properties as the trench or field oxide isolation layer 112. According to an embodiment, the multi-transistor structure 400 contains a bulk diffusion region 424 in the substrate 402 enclosing the well region 401. According to various embodiments, the bulk diffusion region 424 is implemented as a bulk diffusion region for connection to the well region 401. The bulk diffusion region 424 is analogous to the structure of the first impurity type 110 and may be formed from the same and/or similar materials and may share many of the same physical and/or electrical properties as the structure of the first impurity type 110. According to various embodiments, the multi-transistor structure 400 contains at least one body connection electrode 430 formed on the bulk diffusion region 424. In some embodiments, the at least one body connection electrode 430 is analogous to the at least one body connection electrode 122, described in detail above, and may be formed from the same and/or similar materials and may share many of the same physical and/or electrical properties as the at least one body connection electrode 122. In some embodiments, the at least one body connection electrode 430 includes a base layer 430a formed on a surface of the bulk diffusion region 424 and a conductive extension 430b formed on the base layer 430a. According to various embodiments, the base layer 430a is analogous to the base layer 122a, described in detail above, and may be formed from the same and/or similar materials and may share many of the same physical and/or electrical properties. Similarly, conductive extension 430b is analogous to the conductive extension 122b, described in detail above, and may be formed from the same and/or similar materials and may share many of the same physical and/or electrical properties.

Figure 5:
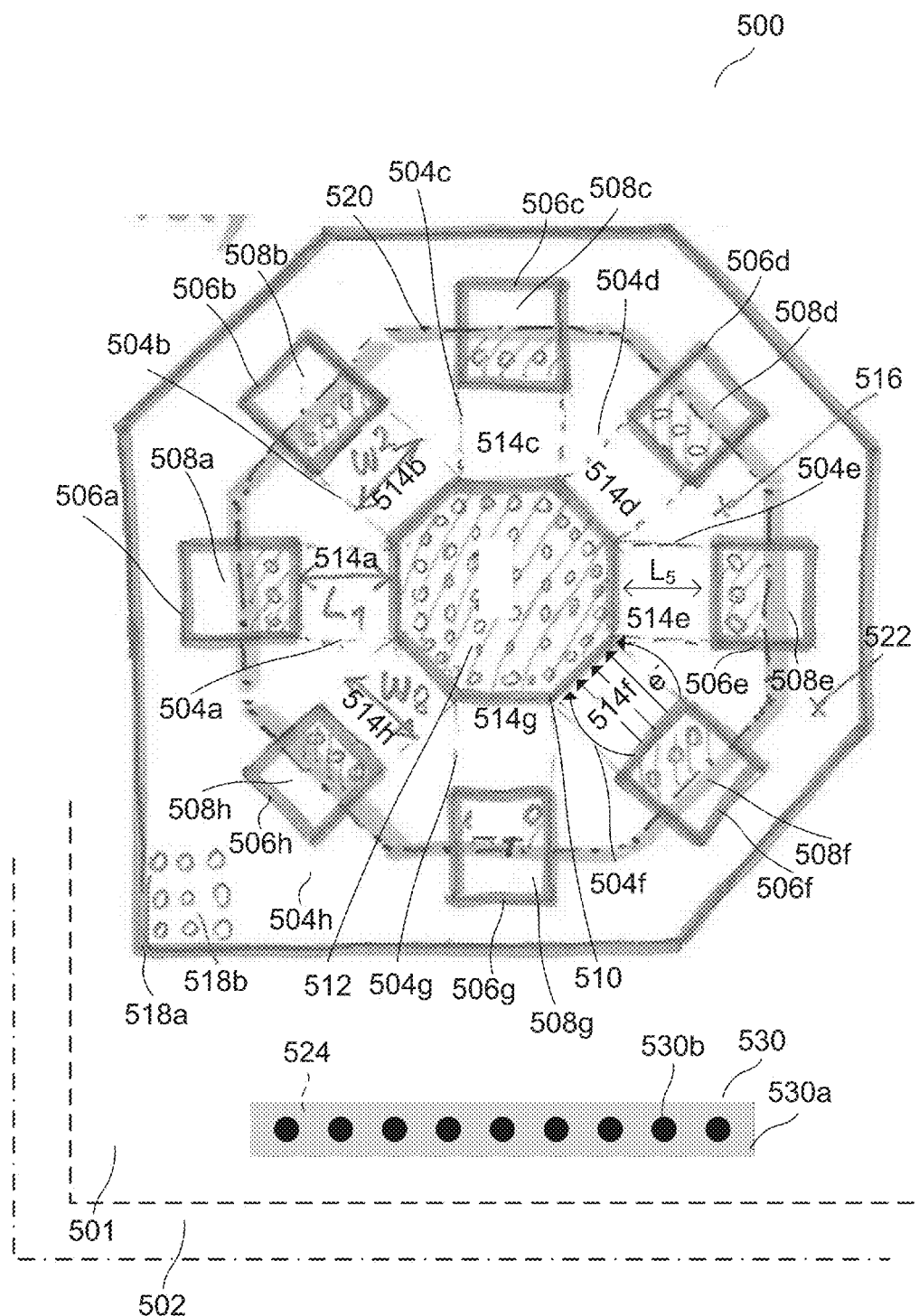
FIG. 5 shows, according to an embodiment a planar top-down view of a multi-transistor structure including eight transistors.

According to various embodiments, as illustrated in FIG. 5, the transistor structure 100 can be implemented as a type of multi-transistor structure 500. In various embodiments, the multi-transistor structure 500 includes a well region 501. The well region 501 may be substantially similar to the well region 101, described above, and may be formed through many of the processes and may contain many of the same physical and/or electrical properties. In various embodiments, the multi-transistor structure 500 includes a substrate 502. The substrate 502 may be substantially similar to the substrate 102, described above, and may be formed through many of the processes and may contain many of the same properties. The multi-transistor structure 500 may be similar or identical to the transistor structure 100 in many respects, differing mainly in the number of transistors 504 it contains. The illustrative embodiment of the multi-transistor structure 500, depicted in FIG. 5 contains eight transistors, represented by reference FIGS. 504a-504h. The transistors 504a-504h may be substantially similar to the at least one transistor 104 and may be formed through many of the processes described above. According to various embodiments, the transistors 504a-504h are each implemented with independent source diffusion regions 506a-506h. The source diffusion regions 506a-506h are analogous to the first diffusion region 104a, described above and may be formed using many of the same processes. According to various embodiments, the transistors 504a-504h are each implemented with source electrodes 508a-508h. The source electrodes 408a-408d are analogous to the source electrode 118 described above and may be implemented using many of the same materials and processes. According to an embodiment, the multi-transistor structure 500 contains a common drain diffusion region 510. The common drain diffusion region 510 may be located in a central portion of the multi-transistor structure 500. In some embodiments, the common drain diffusion region 510 is arranged between the source electrodes 508a-508h. In the embodiment depicted in FIG. 5, the source electrodes 508a-508h are arranged around the perimeter of the common drain diffusion region 510 in an octagonal configuration, however it should be noted that this geometry is exemplary and not intended to be limiting. The source electrodes 508a-508h may be arranged around the common drain diffusion region 510 in a variety of configurations, e.g. in some embodiments the common drain diffusion region 510 and the source electrodes 508a-508h may be parallel to each other. According to an embodiment, the common drain diffusion region 510 is analogous to the second diffusion region 104b, described above and may be formed using many of the same processes and materials. According to an embodiment, the multi-transistor structure 500 contains a common drain electrode 512. The common drain electrode 512 is analogous to the drain electrode 120 described above and may be implemented using many of the same materials and processes. According to an embodiment, the common drain electrode 512 and the common drain diffusion region 510 are coextensive and/or substantially overlap one another. According to an embodiment, the multi-transistor structure 500 contains a channel region for each of the transistors it may contain. In the embodiment depicted in FIG. 5, the multi-transistor structure 500 is implemented with eight channel regions 514a-514h for each of the transistors 504a-504h. According to various embodiments, the channel regions 514a-514h are analogous to the channel 108 described above and may be implemented using many of the same materials and processes. In various embodiments, the length and width of each of the channel regions 514a-514h are depicted by references figures $W_x$ and $L_x$ in FIG. 5, i.e. channel region 514a has a width $W_1$ and a length $L_1$, etc. According to an embodiment, the multi-transistor structure 500 contains an oxide layer 516. In various embodiments, the oxide layer 516 is formed over the common drain diffusion region 510 and extends over each of the channel regions 514a-514h. According to various embodiments, the oxide layer 516 is analogous to the oxide layer 114 described above and may be implemented using many of the same materials and processes. According to an embodiment, the multi-transistor structure 500 contains a gate electrode structure 518, which may be implemented as a gate base layer 518a and a plurality of gate contacts 518b. In the embodiment depicted in FIG. 5, the gate base layer 518a is shown in transparency for clarity of detail of the other elements contained in the multi-transistor structure 500. The gate electrode structure 518 is analogous to gate electrode 116 and may be formed using many of the same processes and material and may share many of the same physical and/or electrical properties as the gate electrode 116. According to an embodiment, the multi-transistor structure 500 contains a boarder interface 520 with the gate oxide layer 516 inside a shallow trench or field oxide isolation layer 522 outside the transistor channel regions 514a-514h. In various embodiments, the border interface 520 is a region where the gate oxide layer 516 stops and the trench or field oxide isolation layer 522 begins. In other words the border interface 520 is a well-defined transition region between the gate oxide layer 516 and the trench or field oxide isolation layer 522, i.e. a border where the gate oxide layer 516 and the trench or field oxide isolation layer 522 are in physical contact. The shallow trench isolation layer 522 is analogous to the trench or field oxide isolation layer 112 and may be formed from the same and/or similar materials as the trench or field oxide isolation layer 112. Further, in an embodiment, the shallow trench isolation layer 522 serves the same purpose the trench or field oxide isolation layer 112. According to an embodiment, the multi-transistor structure 500 contains a bulk diffusion region 524 in the substrate 502 enclosing the well region 501. According to various embodiments, the bulk diffusion region 524 is implemented as a bulk diffusion region for connection to the well region 501. The bulk diffusion region 524 is analogous to the structure of the first impurity type 110 and may be formed from the same and/or similar materials and may share many of the same physical and/or electrical properties as the structure of the first impurity type 110. According to various embodiments, the multi-transistor structure 500 contains at least one body connection electrode 530 formed on the bulk diffusion region 524. In some embodiments, the at least one body connection electrode 530 is analogous to the at least one body connection electrode 122, described in detail above, and may be formed from the same and/or similar materials and may share many of the same physical and/or electrical properties as the at least one body connection electrode 122. In some embodiments, the at least one body connection electrode 530 includes a base layer 530a formed on a surface of the bulk diffusion region 524 and a conductive extension 530b formed on the base layer 530a. According to various embodiments, the base layer 530a is analogous to the base layer 122a, described in detail above, and may be formed from the same and/or similar materials and may share many of the same physical and/or electrical properties. Similarly, conductive extension 530b is analogous to the conductive extension 122b, described in detail above, and may be formed from the same and/or similar materials and may share many of the same physical and/or electrical properties.

Figure 6:
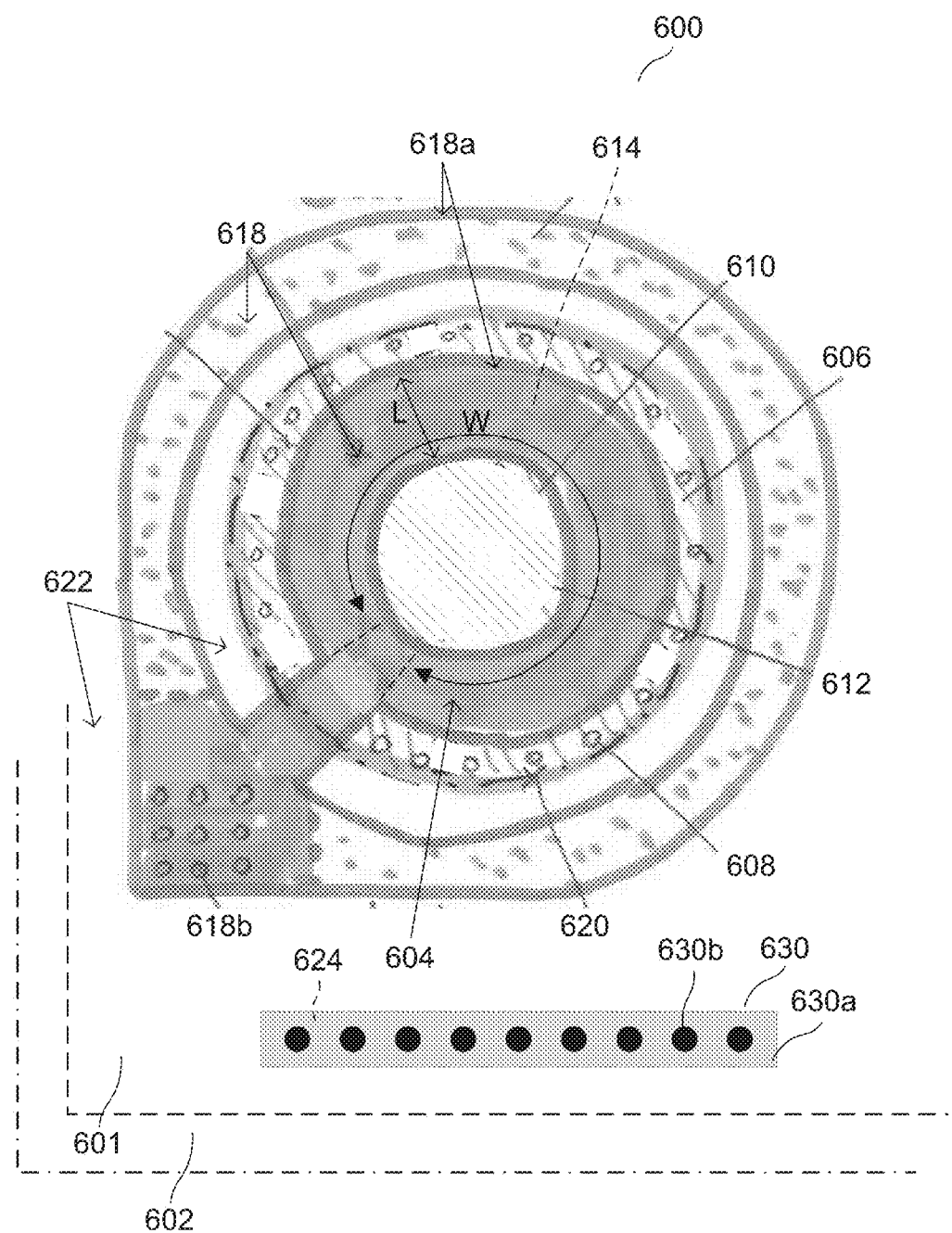
FIG. 6 shows, according to an embodiment a planar top-down view of a ring-shaped transistor structure.

According to various embodiments, as illustrated in FIG. 6, the transistor structure 100 can be implemented as a type of multi-transistor structure 600. In various embodiments, the multi-transistor structure 600 includes a well region 601. The well region 601 may be substantially similar to the well region 101, described above, and may be formed through many of the processes and may contain many of the same physical and/or electrical properties. In various embodiments, the multi-transistor structure 600 includes substrate 602. The substrate 602 may be substantially similar to the substrate 102, described above, and may be formed through many of the processes and may contain many of the same properties. The multi-transistor structure 600 may be similar or identical to the transistor structure 100 in many respects, differing mainly in the number of transistors 604 it contains. The illustrative embodiment of the multi-transistor structure 600, depicted in FIG. 6 contains a continuous and/or infinitely divisible transistor 604. The continuous transistor 604 depicted in FIG. 6 may be substantially similar to the at least one transistor 104 and may be formed through many of the processes described above. According to various embodiments, the continuous transistor 604 is implemented with a source diffusion region 606. The source diffusion region 606 is analogous to the first diffusion region 104a, described above, and may be formed using many of the same processes. In the embodiment depicted in FIG. 6, the source diffusion region 606 is implemented as an annular diffusion region, however it should be noted that this geometry is exemplary and not intended to be limiting. According to various embodiments, the continuous transistor is implemented with a continuous source electrode 608. The continuous source electrode 608 is analogous to the source electrode 118 described above and may be implemented using many of the same materials and processes. In the embodiment depicted in FIG. 6, the continuous source electrode 608 is impended as an annular structure, however it should be noted that this geometry is exemplary and not intended to be limiting. According to an embodiment, the continuous source electrode 608 and the source diffusion region 606 are coextensive and/or substantially overlap one another, in other words the continuous source electrode 608 is formed over and/or directly on the source diffusion region 606. According to an embodiment, the multi-transistor structure 600 contains a common drain diffusion region 610. The common drain diffusion region 610 may be located in a central portion of the multi-transistor structure 600. In some embodiments, the common drain diffusion region 610 is arranged between inside the annular continuous source electrode 608. In the embodiment depicted in FIG. 6, the continuous source electrode 608 and the common drain diffusion region 610 are depicted as concentric annular structures, however it should be noted that this geometry is exemplary and not intended to be limiting. According to an embodiment, the common drain diffusion region 610 is analogous to the second diffusion region 104b, described above, and may be formed using many of the same processes and materials. According to an embodiment, the multi-transistor structure 600 contains a common drain electrode 612. The common drain electrode 612 is analogous to the drain electrode 120 described above and may be implemented using many of the same materials and processes. According to an embodiment, the common drain electrode 612 and the common drain diffusion region 610 are coextensive and/or substantially overlap one another. According to an embodiment, the multi-transistor structure 600 contains a portion of the well region 601 implemented as a transistor channel region 614, in FIG. 6 the channel region 614 is obscured by the gate base layer 618a. In various embodiments, the length and width of each of the transistor channel region 614 is depicted by references figures W and L in FIG. 6. According to an embodiment, the multi-transistor structure 600 contains an oxide layer 616 disposed over the channel region 614. The oxide layer 616 is analogous to the oxide layer 114, described above, and may be formed from the same and/or similar materials. According to an embodiment, the multi-transistor structure 600 contains a gate electrode structure 618, which may be implemented as a gate base layer 618a and a plurality of gate contacts 618b. The gate electrode structure 618 is analogous to gate electrode 116 and may be formed using many of the same processes and material and may share many of the same physical and/or electrical properties as the gate electrode 116. According to an embodiment, the multi-transistor structure 600 contains a border interface 620 to separate the gate oxide layer 616 from the shallow trench or field oxide isolation layer 622. In other words the border interface 620 is a well-defined transition region between the oxide layer 616 and the trench or field oxide isolation layer 622, i.e. a border where the oxide layer 616 and the trench or field oxide isolation layer 622 are in physical contact. The shallow trench isolation layer 622 is analogous to the trench or field oxide isolation layer 112 and may be formed from the same and/or similar materials as the trench or field oxide isolation layer 112. According to an embodiment, the multi-transistor structure 600 contains a bulk diffusion region 624 in the substrate 602 enclosing the well region 601. According to various embodiments, the bulk diffusion region 624 is implemented as a bulk diffusion region for connection to the well region 601. The bulk diffusion region 624 is analogous to the structure of the first impurity type 110 and may be formed from the same and/or similar materials and may share many of the same physical and/or electrical properties as the structure of the first impurity type 110. According to various embodiments, the multi-transistor structure 600 contains at least one body connection electrode 630 formed on the bulk diffusion region 624. In some embodiments, the at least one body connection electrode 630 is analogous to the at least one body connection electrode 122, described in detail above, and may be formed from the same and/or similar materials and may share many of the same physical and/or electrical properties as the at least one body connection electrode 122. In some embodiments, the at least one body connection electrode 630 includes a base layer 630a formed on a surface of the bulk diffusion region 624 and a conductive extension 630b formed on the base layer 630a. According to various embodiments, the base layer 630a is analogous to the base layer 122a, described in detail above, and may be formed from the same and/or similar materials and may share many of the same physical and/or electrical properties. Similarly, conductive extension 630b is analogous to the conductive extension 122b, described in detail above, and may be formed from the same and/or similar materials and may share many of the same physical and/or electrical properties.

The following examples pertain to further embodiments.

In Example 1, a transistor structure, which includes a substrate; a well region of a first impurity type in the substrate; at least one transistor formed at least partially on the well region, a portion of the well region comprising a transistor channel; a structure of the first impurity type in the substrate enclosing the well region; and a trench and/or field oxide isolation layer in the substrate enclosing the structure; where a concentration of the first impurity type in the structure enclosing the well region is higher than a concentration of the first impurity type in the well region.

In Example 2, the transistor structure of Example 1, where the first impurity type is a p-type dopant and the second impurity type is an n-type dopant.

In Example 3, a transistor structure, which includes a substrate; a well region of a first impurity type in the substrate; at least one transistor formed at least partially on the well region, the transistor having a drain region in the well region and a plurality of source regions at least partially in the well region, said source regions being arranged around the gate region; the well region including a plurality of channels separating the drain region from the plurality of source regions; a structure of the first impurity type in the substrate enclosing the well region; and a trench and/or field oxide isolation layer in the substrate enclosing the isolation structure; where a concentration of the first impurity type in the structure enclosing the well region is higher than a concentration of the first impurity type in the well region.

In Example 4, the transistor structure of Example 3, further includes an oxide layer over the well region which surrounds the drain region and extends over each of the channels from the plurality and/or overlaps the channel-regions, known from classical CMOS-transistor layouts, defined by W (channel-width); and a gate electrode on the oxide layer, e.g. the channel-width is not determined any more by the lateral interface of the oxide-layer (GOX) and the field-oxide layer (e.g. LOCOS or STI), as it is state of the art today in a classical CMOS-transistor.
The definition of the channel length remains un-changed, as known from stat of the art, determined by the length of the gate-electrode between source and drain.

In Example 5, the transistor structure of Example 3 & 4, where a lateral extension of the oxide layer is bounded by the structure of the first impurity type.

In Example 6, the transistor structure Examples 3-5, where the drain region includes a substantially square structure; and the plurality of source regions include four source regions arranged around the perimeter of the drain region in a substantially cross-shaped configuration.

In Example 7, the transistor structure of Examples 3-5, where the drain region includes a substantially octagonal structure; and the plurality of source regions include eight source regions arranged around the perimeter of the drain diffusion region in a substantially octagonal configuration. Generally the drain region is determined by a $2^n$-corner structure and $2^n$ sources are arranged around the common drain diffusion. n=1, 2, 3, 4 . . . ∞.

In Example 8, the transistor structure of Examples 3-5, where the drain region includes a substantially circular structure; and the plurality of source regions includes a substantially annular structure concentrically arranged with the drain region. Compare to Example 7: n=∞.

In Example 9, the transistor structure of Example 8, where the gate electrode includes a substantially annular structure situated concentrically with the drain region and a planar section extending over the drain region and the plurality of source regions.

In Example 10, the at least one field effect transistor of Examples 3-9, where the first impurity type is a p-type dopant and the second impurity type is an n-type dopant; or or: where the first impurity type is a n-type dopant and a second impurity type is an p-type dopant.

In Example 11, at least one field effect transistor includes a substrate; a gate dielectric layer on the substrate; and a trench or a field oxide isolation layer in the substrate enclosing the gate dielectric layer; where the gate dielectric layer is structured such that it does not extend over the trench isolation layer.

In Example 12, the at least one field effect transistor of Example 11 further includes a well region of a first impurity type in the substrate; and at least one transistor gate formed at least partially on the well region, a portion of the well region including a least one transistor channel; where the gate dielectric layer is arranged between the at least one transistor gate and the at least one transistor channel.

In Example 13, the at least one field effect transistor of Examples 11 & 12 further includes a ring structure of the first impurity type arranged in the substrate between the well region and the trench and/or field oxide isolation layer; where a concentration of the first impurity type in the ring structure is higher than a concentration of the first impurity type in the well region.

In Example 14, the at least one field effect transistor of Example 13, where a lateral extension of the gate dielectric layer is bounded and/or terminated by a ring structure for source or drain diffusion.

In Example 15, the at least one field effect transistor of Examples 11-14 further includes a drain region in the well region and a plurality of source regions at least partially in the well region, said source regions being arranged around the at least one transistor gate.

In Example 16, the at least one field effect transistor of Example 15, where the plurality of source regions include four source regions arranged around the perimeter of the drain region in a substantially cross-shaped configuration; and where the well region includes four transistor channels, one channel formed between each source region and a corresponding portion of the drain region.

In Example 17, the at least one field effect transistor of Example 15, where the plurality of source regions includes eight source regions arranged around the perimeter of the drain diffusion region in a substantially octagonal configuration; and where the well region includes eight transistor channels, one channel formed between each source region and a corresponding portion of the drain region. Generally the number of transistor-channels is determined by 2n, n=1, 2, 3, 4 . . . ∞.

In Example 18, the at least one field effect transistor of Example 15, where the drain region includes a substantially circular structure; and the plurality of source regions includes a substantially annular structure concentrically arranged with the drain region. See Example 17: n=∞.

In Example 19, the at least one field effect transistor of Example 18, where the gate electrode includes an annular structure situated concentrically with the drain region and a planar section extending from the annular structure over the drain region and the plurality of source regions. Optional the source region might be placed in the center as common source diffusion surrounded by a plurality of drain regions.

In Example 20, the at least one field effect transistor of Examples 11-19, where the first impurity type is a p-type dopant and the second impurity type is an n-type dopant; or: where the first impurity type is a n-type dopant and a second impurity type is a p-type dopant.

In Example 21, a transistor structure which includes a substrate; a well region of a first impurity type in the substrate; a first diffusion region of a second impurity type in the well region; a second diffusion region of the second impurity type in the well region, a portion of the well region forming a channel separating the first diffusion region and the second diffusion region; an isolation structure of the first impurity type in the substrate enclosing the well region; and a trench isolation layer in the substrate enclosing the isolation structure; where a concentration of the first impurity type in the isolation structure is higher than a concentration of the first impurity type in the well region.

In Example 22, the transistor structure of Example 21 further includes an oxide layer over the channel; a gate electrode on the oxide layer; a source electrode on the first diffusion region; a drain electrode on the second diffusion region; and at least one body connection electrode on the isolation structure.

In Example 23, the transistor structure of Examples 21 and 22 further includes at least one lightly doped drain region of the second impurity type extending from the perimeter of the first diffusion region and into the channel, the at least one lightly doped drain region having a concentration of the second impurity type which is lower than a concentration of the second impurity type in the first diffusion region; and at least one lightly doped drain region of the second impurity type extending from the perimeter of the second diffusion region and into the channel, the at least one lightly doped drain region having a concentration of the second impurity type which is lower than a concentration of the second impurity type in the second diffusion region.

In Example 24, the transistor structure of Examples 21 & 23, where the gate electrode includes a stack layer formed on the oxide layer and a spacer structure on at least one sidewall of the stack layer.

In Example 25, the transistor structure of Examples 21-24, where the source electrode is electrically coupled to the at least one body connection electrode.

In Example 26, the transistor structure of Examples 21-25, where the first impurity type includes a p-type dopant and the second impurity type includes an n-type dopant.

In Example 27, a transistor structure, which includes a substrate; a well region of a first impurity type in the substrate; a primary diffusion region of a second impurity type in the well region; a plurality of secondary diffusion regions of the second impurity type in the well region arranged around the perimeter of the primary diffusion region; the well region including a plurality of channels separating the primary diffusion region from the secondary diffusion regions; an isolation structure of the first impurity type in the substrate enclosing the well region; and a trench isolation layer in the substrate enclosing the isolation structure; where a concentration of the first impurity type in the isolation structure is higher than a concentration of the first impurity type in the well region.

In Example 28, the transistor structure of Example 27, further including an oxide layer over the well region which surrounds the primary diffusion region and extends over each of the channels from the plurality; a gate electrode on the oxide layer; at least one drain electrode in the primary diffusion region; at least one source electrode in each of the secondary diffusion regions; and at least one body connection electrode in the isolation structure.

In Example 29, the transistor structure of Examples 27 & 28, where gate electrode includes a stack layer formed on the oxide layer and a at least one gate contact formed on the gate electrode.

In Example 30, the transistor structure of Examples 27-29, where at least one source electrode from each of the secondary diffusion regions is electrically coupled to the at least one body connection electrode.

In Example 31, the transistor structure of Examples 27-30, where the primary diffusion region is a transistor drain region; and the plurality of secondary diffusion regions is a plurality of transistor source regions.

In Example 32, the transistor structure of Examples 27-31, where the plurality of secondary diffusion regions includes four diffusion regions arranged around the perimeter of the primary diffusion region to form a substantially cross-shaped configuration.

In Example 33, the transistor structure of Examples 27-32, where the plurality of secondary diffusion regions includes eight diffusion regions arranged around the perimeter of the primary diffusion region in a substantially octagonal configuration.

In Example 34, the transistor structure of Examples 27-33, where the primary diffusion region includes a substantially circular structure and; where the plurality of secondary diffusion regions includes substantially annular structure concentrically arranged with the primary diffusion region.

In Example 35, the transistor structure of Examples 27-34, where and the gate electrode includes a substantially annular structure situated concentrically with the primary diffusion region and a planar section extending over the primary diffusion region and the secondary diffusion region.

In Example 36, a method of forming a transistor structure, the method including providing a substrate; forming a well region of a first impurity type in the substrate; forming a first diffusion region of a second impurity type in the well region; forming a second diffusion region of the second impurity type in the well region, shaping a portion of the well region to form a channel separating the first diffusion region and the second diffusion region; forming an isolation structure of the first impurity type in the substrate to enclose the well region; and forming a trench isolation layer in the substrate to enclose the isolation structure; where a concentration of the first impurity type in the isolation structure is higher than a concentration of the first impurity type in the well region.

In Example 37, the method of Example 36 further includes forming an oxide layer over the channel; providing a gate electrode on the oxide layer; forming a source electrode on the first diffusion region; forming a drain electrode on the second diffusion region; and forming at least one body connection electrode on the isolation structure.

In Example 38, the method of Examples 36 & 37 further includes forming at least one lightly doped drain region of the second impurity type extending from the perimeter of the first diffusion region and into the channel, the at least one lightly doped drain region having a concentration of the second impurity type which is lower than a concentration of the second impurity type in the first diffusion region; and forming at least one lightly doped drain region of the second impurity type extending from the perimeter of the second diffusion region and into the channel, the at least one lightly doped drain region having a concentration of the second impurity type which is lower than a concentration of the second impurity type in the second diffusion region.

In Example 39, a method for forming a transistor structure includes providing a substrate; forming a well region of a first impurity type in the substrate; forming a primary diffusion region of a second impurity type in the well region; forming a plurality of secondary diffusion regions of the second impurity type in the well region; arranging the plurality of secondary diffusion regions around the perimeter of the primary diffusion region; forming the well region into a plurality of channels separating the primary diffusion region from the secondary diffusion regions; forming an isolation structure of the first impurity type in the substrate enclosing the well region; and providing a trench isolation layer in the substrate enclosing the isolation structure; where a concentration of the first impurity type in the isolation structure is higher than a concentration of the first impurity type in the well region.

In Example 40, the method of Example 39 further includes forming an oxide layer over the well region and shaping the oxide layer to surround the primary diffusion region and extend over each of the channels from the plurality; providing a gate electrode on the oxide layer; forming at least one drain electrode in the primary diffusion region; forming at least one source electrode in each of the secondary diffusion regions; and forming at least one body connection electrode in the isolation structure.

What is claimed is:

1. A transistor structure, comprising:
   a substrate;
   a well region of a first impurity type in the substrate;
   at least one transistor formed at least partially on the well region, a portion of the well region comprising a transistor channel;
   a structure of the first impurity type in the substrate enclosing the well region; and
   an isolation layer on a portion of the substrate surrounding the structure;
   wherein a concentration of the first impurity type in the structure enclosing the well region is higher than a concentration of the first impurity type in the well region.

2. The transistor structure of claim 1, wherein the first impurity type comprises a p-type dopant.

3. A transistor structure, comprising:
   a substrate;
   a well region of a first impurity type in the substrate;
   at least one transistor formed at least partially on the well region, the transistor having a drain region in the well region and a plurality of source regions at least partially in the well region, said source regions being arranged around the gate region; the well region comprising a plurality of channels separating the drain region from the plurality of source regions;
   a structure of the first impurity type in the substrate enclosing the well region; and
   an isolation layer in the substrate enclosing the structure of the first impurity type;
   wherein a concentration of the first impurity type in the structure enclosing the well region is higher than a concentration of the first impurity type in the well region.

4. The transistor structure of claim 3, further comprising:
   an oxide layer above the well region which surrounds the drain region and extends over each of the channels from the plurality; and
   a gate electrode on the oxide layer.

5. The transistor structure of claim 4, wherein a lateral extension of the oxide layer is bounded by the structure of the first impurity type.

6. The transistor structure of claim 3, wherein the drain region comprises a substantially square structure; and
   wherein the plurality of source regions comprise four source regions arranged around the perimeter of the drain region in a substantially cross-shaped configuration.

7. The transistor structure of claim 3, wherein the drain region comprises a substantially octagonal structure; and
   wherein the plurality of source regions comprise eight source regions arranged around the perimeter of the drain diffusion region in a substantially octagonal configuration.

8. The transistor structure of claim 3, wherein the drain region comprises a substantially circular structure; and
   wherein the plurality of source regions comprise a substantially annular structure concentrically arranged with the drain region.

9. The transistor structure of claim 8, wherein the gate electrode comprises a substantially annular structure situated concentrically with the drain region and a planar section extending over the drain region and the plurality of source regions.

10. The at least one field effect transistor of claim 3, wherein the first impurity type comprises a p-type dopant; or
    wherein the first impurity type comprises a n-type dopant.

* * * * *